(12) United States Patent
Lai et al.

(10) Patent No.: US 12,199,073 B2
(45) Date of Patent: Jan. 14, 2025

(54) MICRO LIGHT EMITTING DIODE DISPLAY AND METHOD OF FORMING THE SAME

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Chih-Wei Lai, Guangdong (CN); Hui-Ping Shen, Guangdong (CN)

(73) Assignees: Interface Technology (ChengDu) Co., Ltd., Sichuan (CN); Interface Optoelectronics (ShenZhen) Co., Ltd., Guangdong (CN); General Interface Solution Limited, Miaoli County (TW)

( * ) Notice: Subject to any disclaimer, the term of this patent is extended or adjusted under 35 U.S.C. 154(b) by 415 days.

(21) Appl. No.: 17/580,616

(22) Filed: Jan. 20, 2022

(65) Prior Publication Data

US 2023/0178521 A1  Jun. 8, 2023

(30) Foreign Application Priority Data

Dec. 2, 2021 (CN) .......................... 202111463507.7

(51) Int. Cl.
 *H01L 33/44* (2010.01)
 *H01L 25/075* (2006.01)
 *H01L 33/00* (2010.01)
 *H01L 33/50* (2010.01)

(52) U.S. Cl.
 CPC ........ *H01L 25/0753* (2013.01); *H01L 33/005* (2013.01); *H01L 33/44* (2013.01); *H01L 33/502* (2013.01); *H01L 2933/0025* (2013.01); *H01L 2933/0041* (2013.01)

(58) Field of Classification Search
 None
 See application file for complete search history.

(56) References Cited

U.S. PATENT DOCUMENTS

| | | | |
|---|---|---|---|
| 2019/0229097 A1* | 7/2019 | Takeya | H01L 25/167 |
| 2019/0273179 A1* | 9/2019 | Iguchi | H01L 25/0753 |
| 2019/0371600 A1* | 12/2019 | Chang | H01L 21/02282 |
| 2020/0019057 A1* | 1/2020 | Fukuhara | G03F 7/027 |
| 2020/0328196 A1* | 10/2020 | Han | H01L 22/22 |
| 2022/0093579 A1* | 3/2022 | Kishimoto | H01L 27/156 |
| 2022/0342303 A1* | 10/2022 | Kanna | G03F 7/327 |

FOREIGN PATENT DOCUMENTS

CN 114361366 A * 4/2022

OTHER PUBLICATIONS

English translation of CN-114361366-A (Year: 2024).*

* cited by examiner

*Primary Examiner* — Xiaoming Liu
(74) *Attorney, Agent, or Firm* — CKC & Partners Co., LLC

(57) ABSTRACT

The present disclosure provides a micro light emitting diode display including a metal substrate, a plurality of micro light emitting diode chips on the metal substrate, a plurality of light absorbing layers on the metal substrate between the micro light emitting diode chips, a light conversion layer above the micro light emitting diode chips, and a cover plate above the light conversion layer, where sidewalls of the micro light emitting diode chips are separated by a gap, and where a contact angle of the light absorbing layers is between 0 degree and 30 degrees.

20 Claims, 12 Drawing Sheets

MICRO LIGHT EMITTING DIODE DISPLAY AND METHOD OF FORMING THE SAME

CROSS-REFERENCE TO RELATED APPLICATION

This application claims priority to China Application Serial Number 202111463507.7, filed on Dec. 2, 2021, which is herein incorporated by reference in its entirety.

BACKGROUND

Field of Invention

The present disclosure relates to the micro light emitting diode display and the method of forming the same.

Description of Related Art

In the development of the light emitting devices, the size of the light emitting chip in the devices gradually decreases. As such, the light emitting chip can become an individual cell of the light emitting device, which improves the performance of the device and reduces the power consumption of the device. For example, the micro light emitting diode (micro LED), as a digital cell of a display, can increase the definition and the contrast of the display, decrease the response time of the display, and reduce the power consumption of the display. However, the decreased size of the light emitting chip also reduces the width of the gap between the light emitting chips. As a result, the light emitting chips are easily interfered by each other, and the imaging performance of the display is affected. Therefore, it is an important development project for the light emitting device field to improve the optical performance of the light emitting chip and the imaging quality of the display.

SUMMARY

According to some embodiments of this disclosure, a micro light emitting diode display includes a metal substrate, a plurality of micro light emitting diode chips on the metal substrate, a plurality of light absorbing layers on the metal substrate between the micro light emitting diode chips, a light conversion layer above the micro light emitting diode chips, and a cover plate above the light conversion layer, where sidewalls of the micro light emitting diode chips are separated by a gap, and where a contact angle of the light absorbing layers is between 0 degree and 30 degrees.

In some embodiments, the light absorbing layers include a carbon black and anions from a thermal acid generator.

In some embodiments, a wavelength absorbed by the light absorbing layers is between 380 nm and 780 nm.

In some embodiments, the light absorbing layers have an absorbance no less than 99% in a wavelength range between 540 nm and 560 nm.

In some embodiments, a thickness of the light absorbing layers is between 1 μm and 2 μm.

In some embodiments, the light absorbing layers directly contact the sidewalls of the micro light emitting diode chips.

In some embodiments, the gap separating the micro light emitting diode chips is between 0.5 μm and 10 μm.

In some embodiments, the light absorbing layers do not cover the micro light emitting diode chips.

In some embodiments, the light conversion layer includes quantum dot layers and corresponding color filters.

In some embodiments, the quantum dot layers transfer a blue light emitted by the micro light emitting diode chips into a red light or a green light.

According to some embodiments of this disclosure, a method of forming a micro light emitting diode display includes the following steps. A plurality of micro light emitting diode chips are attached on a metal substrate, where sidewalls of the micro light emitting diode chips are separated by a gap. A light absorbing layer precursor is formed on the micro light emitting diode chips and the metal substrate, where the light absorbing layer precursor includes a thermal acid generator. The metal substrate is heated to let the thermal acid generator on the metal substrate release acids. The metal substrate is immersed in an organic solution, where a portion of the light absorbing layer precursor on the micro light emitting diode chips is dissolved in the organic solution, and a remained portion of the light absorbing layer precursor on the metal substrate forms a plurality of light absorbing layers between the micro light emitting diode chips. The metal substrate is dried, and a cover plate including a light conversion layer is attached above the micro light emitting diode chips, where the light conversion layer is aligned with the micro light emitting diode chips.

In some embodiments, before heating the metal substrate, a contact angle of the light absorbing layer precursor on the metal substrate is between 70 degrees and 90 degrees.

In some embodiments, after heating the metal substrate, a contact angle of the light absorbing layer precursor on the metal substrate is between between 0 degree and 30 degrees.

In some embodiments, the thermal acid generator is selected from Diphenyl(4-(phenylthio)phenyl)sulfonium perfluorobutane sulfonate, Diphenyl(4-(phenylthio)phenyl) sulfonium 4-adamantanecarboxy-1,1,2,2,-tetrafluorobutane sulfonate, Diphenyl(4-(phenylthio)phenyl)sulfonium 3-hydroxy-4-adamantanecarboxyl-1,1,2,2-tetrafluorobutane sulfonate, Diphenyl(4-(phenylthio)phenyl)sulfonium adamantanyl-methoxycarbonyl-difluoromethane sulfonate, Diphenyl(4-(phenylthio)phenyl)sulfonium 3-hydroxyadamantanyl-methoxycarbonyl-difluoromethane sulfonate, or Diphenyl(4-(phenylthio)phenyl)sulfonium 4-dehydrocholate-1,1,2,2-tetrafluorobutane sulfonate.

In some embodiments, a concentration of the thermal acid generator in the light absorbing layer precursor is between 0.1 wt % and 5 wt %.

In some embodiments, the light absorbing layer precursor further includes a carbon black absorbing wavelength between 380 nm and 780 nm.

In some embodiments, heating the metal substrate includes heating the metal substrate with a temperature between 100° C. and 140° C.

In some embodiments, forming the light absorbing layer precursor includes spin coating the light absorbing layer precursor on upper surfaces of the micro light emitting diode chips and the metal substrate between the micro light emitting diode chips.

In some embodiments, the light absorbing layer precursor on the metal substrate between the micro light emitting diode chips has a width between 0.5 μm and 10 μm.

In some embodiments, attaching the micro light emitting diode chips on the metal substrate includes mass transferring the micro light emitting diode chips onto the metal substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 to FIG. 7A, FIG. 8, and FIG. 9 illustrate cross-sectional views of the intermediate stages of forming the micro light emitting diode display according to some embodiments of this disclosure.

DETAILED DESCRIPTION

Figure 1A:
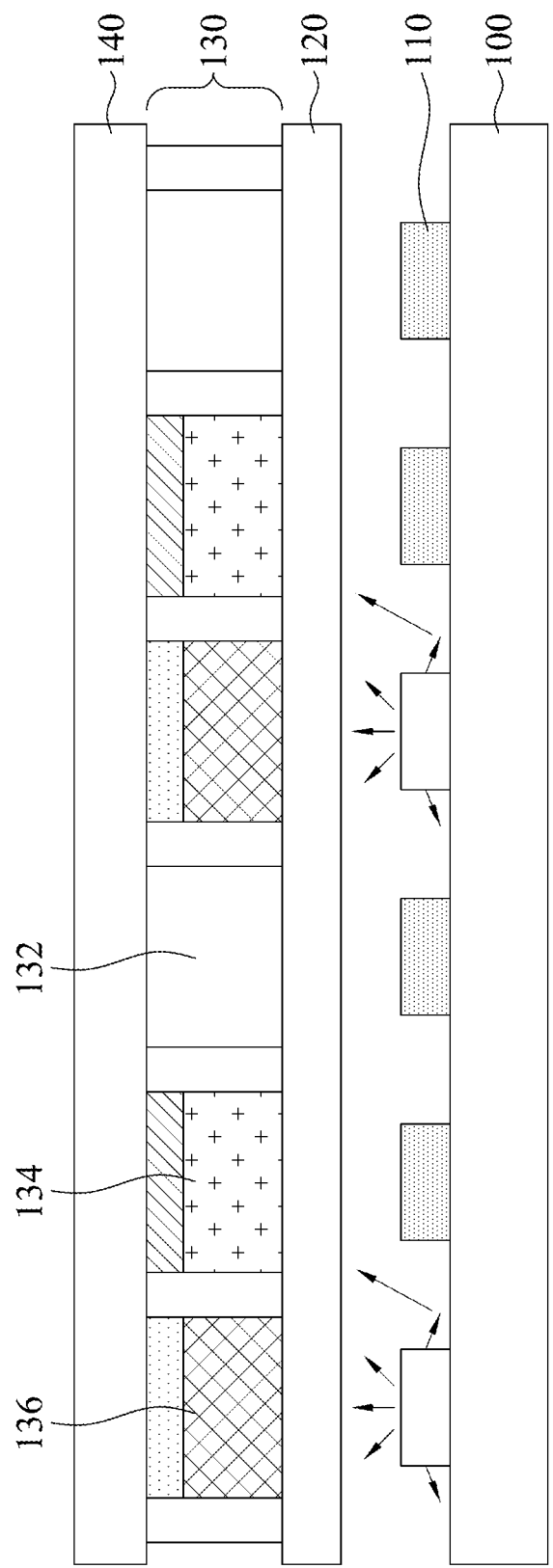
FIG. 1A illustrates a cross-sectional view of a micro light emitting diode display.

The following disclosure provides many different embodiments, or examples, for implementing different features of the provided subject matter. Specific examples of components, values, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, a micro light emitting diode display includes a metal substrate, micro light emitting diode chips on the metal substrate, and a light conversion layer above the micro light emitting diode chips. The current is provided to the micro light emitting diode chips by the metal substrate, so that the micro light emitting diode chips can emit light toward the light conversion layer. While the light pass through the light conversion layer, the incident light can be transferred into emissive light with different characteristics, such as different wavelengths, thereby allowing the micro light emitting diode display present colorful images.

Figure 1B:
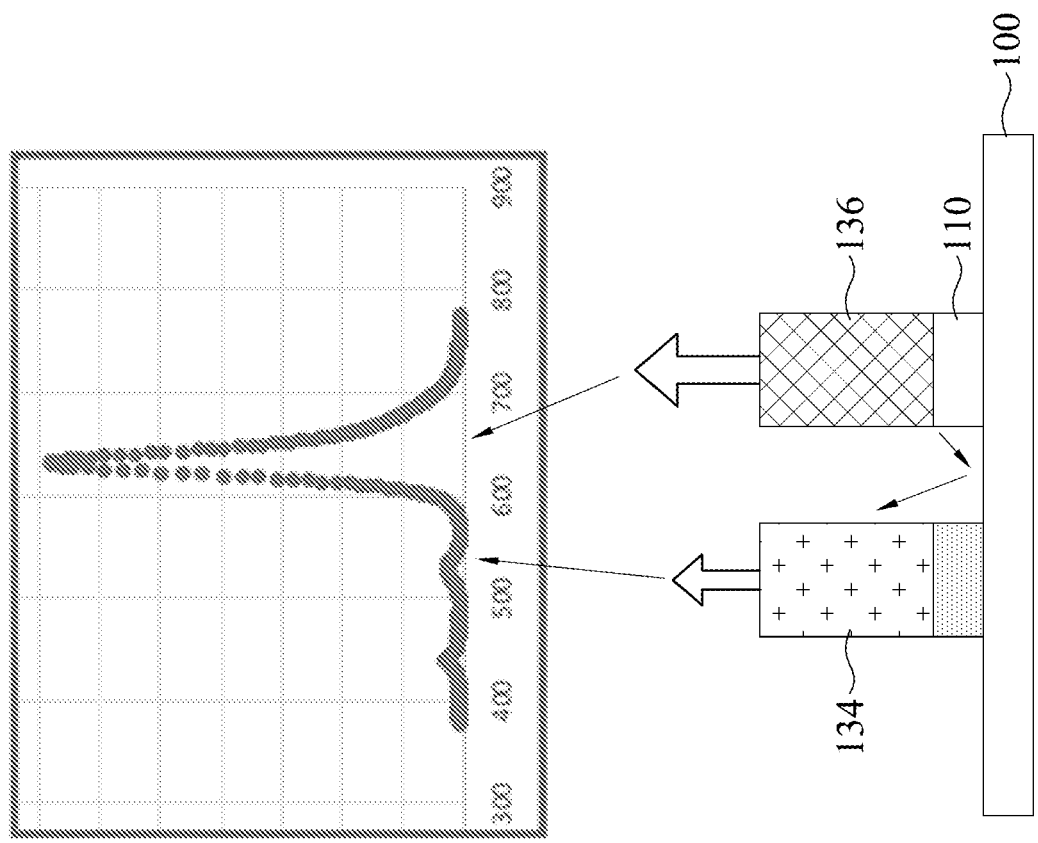
FIG. 1B illustrates an enlarged schematic view and a corresponding spectrum of the micro light emitting diode display in FIG. 1A emitting the red light.

For example, FIG. 1A illustrates the cross-sectional view of the micro light emitting diode display 10, while FIG. 1B illustrates the enlarged schematic view and the corresponding spectrum of the micro light emitting diode display 10 emitting the red light. The micro light emitting diode display 10 includes a metal substrate 100, a plurality of micro light emitting diode chips 110 on the metal substrate 100, a transparent substrate 120 above the micro light emitting diode chips 110, a light conversion layer 130 on the transparent substrate 120, and a cover plate 140 above the light conversion layer 130. The micro light emitting diode chips 110 on the metal substrate 100 emit the light toward the light conversion layer 130. As such, the light sequentially passes through the transparent substrate 120, light conversion layer 130, and the cover plate 140, where the light conversion layer 130 includes a transparent layer 132, a green light conversion layer 134, and a red light conversion layer 136 that respectively corresponds to different micro light emitting diode chips 110. By the light conversion layer 130 that can transfer the light into various color lights, the light emitted by the micro light emitting diode chips 110 provides the imaging functionality of the micro light emitting diode display 10.

As shown in FIG. 1A, the light emitted by the micro light emitting diode chips 110 lacks directionality. As a result, a portion of the light emitted by the micro light emitting diode chips 110 reaches the metal substrate 100. The light reaching the metal substrate 100 is reflected by the metal substrate 100, which may be directed to undesired regions. In addition, the gap between the micro light emitting diode chips 110 are very small due to the small size of the micro light emitting diode chips 110. For example, if the size of the micro light emitting diode chips 110 is no larger than 30 μm, the gap between the micro light emitting diode chips 110 may be no larger than 10 μm. As the gap between the micro light emitting diode chips 110 is small, the light emitted by one of the micro light emitting diode chips 110 may reach the light conversion layer 130 above other adjacent micro light emitting diode chips 110 after being reflected by the metal substrate 100. As such, the light may be emitted from the undesired region of the light conversion layer 130 and may affect the imaging of the micro light emitting diode display 10.

For example, as shown in FIG. 1A and FIG. 1B, when the light is emitted from the micro light emitting diode chip 110 below the red light conversion layer 136, a portion of the light travels toward the red light conversion layer 136 and becomes the red light of the micro light emitting diode display 10 after passing through the red light conversion layer 136. Meanwhile, another portion of the light of the micro light emitting diode chip 110 travels toward the metal substrate 100. The light reaching the metal substrate 100 is reflected by the metal substrate 100, thereby passing through the adjacent green light conversion layer 134, which emits weak green light. Therefore, in the last imaging of the micro light emitting diode display 10, the red light may be mixed with the green light, which affects the color tone and the imaging performance of the micro light emitting diode display 10. This undesired interference of the emissive light is herein referred as light cross-talk.

Figure 2A:
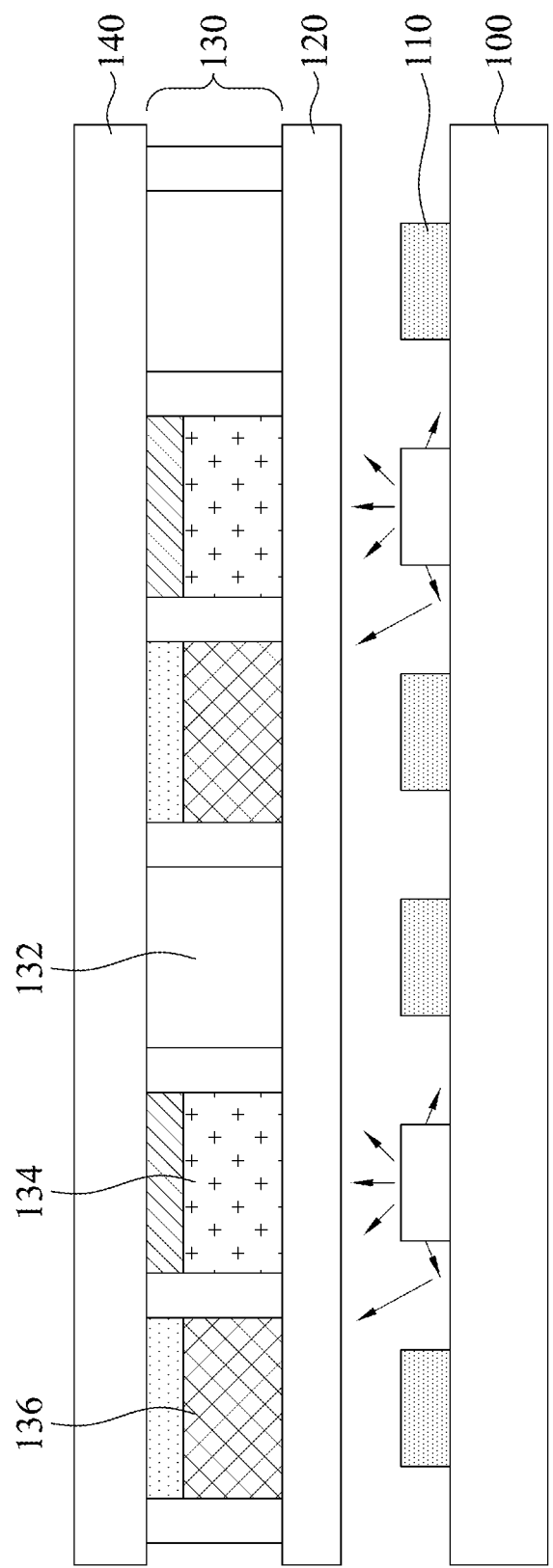
FIG. 2A illustrates a cross-sectional view of a micro light emitting diode display.
Figure 2B:
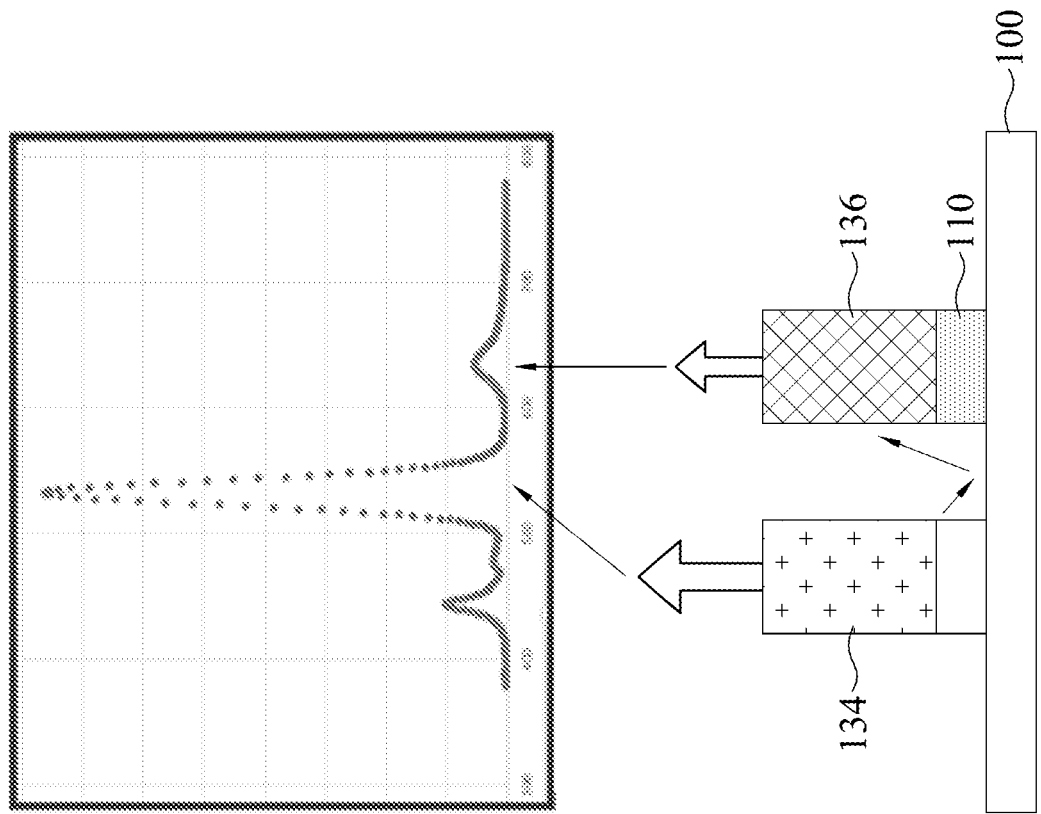
FIG. 2B illustrates an enlarged schematic view and a corresponding spectrum of the micro light emitting diode display in FIG. 2A emitting the green light.

Similarly, FIG. 2A illustrates the cross-sectional view of the micro light emitting diode display 20, and FIG. 2B illustrates the enlarged schematic view and the corresponding spectrum of the micro light emitting diode display 20 emitting green light. The micro light emitting diode display 20 is similar to the micro light emitting diode display 10 in FIG. 1A, except the light is emitted from the micro light emitting diode chip 110 below the green light conversion layer 134 of the micro light emitting diode display 20. As shown in FIG. 2A and FIG. 2B, a portion of the light travels toward the green light conversion layer 134 and becomes the green light of the micro light emitting diode display 20 after passing through the green light conversion layer 134. Meanwhile, another portion of the light of the micro light emitting diode chip 110 travels toward the metal substrate 100 and is reflected by the metal substrate 100. Since the gap between the micro light emitting diode chips 110 is small, the light reflected by the metal substrate 100 may pass through the adjacent red light conversion layer 136, which emits weak red light. Therefore, in the last imaging of the micro light emitting diode display 20, the green light may be mixed with the red light, which leads to the light cross-talk and affects the color tone and the imaging performance of the micro light emitting diode display 20.

The present disclosure provides a micro light emitting diode display and the method of forming the micro light emitting diode display, which avoid the undesired light cross-talk. The micro light emitting diode display includes a metal substrate, a plurality of micro light emitting diode chips on the metal substrate, and a plurality of light absorbing layers on the metal substrate between the micro light emitting diode chips, where the light absorbing layers have a contact angle between 0 degree and 30 degrees. Since the light absorbing layers on the metal substrate between the micro light emitting diode chips can absorb the light, the metal substrate would not reflect the light emitted by the micro light emitting diode chips, and the light cross-talk would be avoided. Further, as the contact angle of the light absorbing layers is between 0 degree and 30 degrees, the patterning of the light absorbing layers may be performed by simple process operations, which avoid the application of high cost photolithography process.

Figure 3:
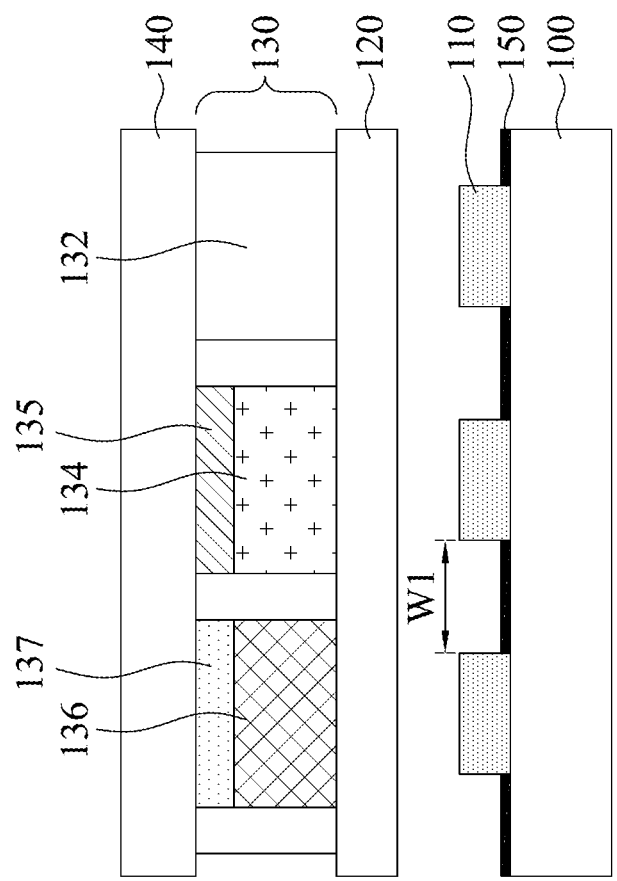
FIG. 3 illustrates a cross-sectional view of a micro light emitting diode display according to some embodiments of this disclosure.

According to some embodiments of this disclosure, FIG. 3 illustrates the cross-sectional view of the micro light emitting diode display 30. The micro light emitting diode display 30 includes a metal substrate 100, a plurality of micro light emitting diode chip 110 on the metal substrate 100, light absorbing layers 150 on the metal substrate 100 between the micro light emitting diode chips 110, a transparent substrate 120 above the micro light emitting diode chips 110, a light conversion layer 130 on the transparent substrate 120, and a cover plate 140 above the light conversion layer 130. When the micro light emitting diode chips 110 receive the current provided by the metal substrate 100 and emit the light, the light pass through the transparent substrate 120, the light conversion layer 130, and the cover plate 140 to provide the imaging of the micro light emitting diode display 30. Meanwhile, a portion of the light emitted by the micro light emitting diode chips 110 may travel toward the metal substrate 100. Since the light absorbing layers 150 cover the metal substrate 100 between the micro light emitting diode chips 110, the light absorbing layers 150 can absorb the light emitted toward the metal substrate 100 by the micro light emitting diode chips 110, which avoids the light reflection from the metal substrate 100. Therefore, the light absorbing layers 150 on the metal substrate 100 can avoid the light cross-talk, thereby increasing the color saturation of the micro light emitting diode display 30 and improving the color performance of the micro light emitting diode display 30.

More specifically, the light absorbing layers 150 are hydrophilic so that a contact angle of the light absorbing layers 150 is between 0 degree and 30 degrees. For example, the contact angle of the light absorbing layers 150 may be 5 degrees, 10 degrees, 15 degrees, 20 degrees, or 25 degrees. As the light absorbing layers 150 have suitable contact angle, i.e., the light absorbing layers 150 have suitable hydrophilicity, the light absorbing layers 150 have low solubility corresponding to specific solvents (for example, non-polar organic solvents). Therefore, in the process of forming the micro light emitting diode display 30, the patterning process of the light absorbing layers 150 may be simplified by the solubility characteristic of the light absorbing layers 150, thereby decreasing the process cost of the micro light emitting diode display 30. The advantages due to the suitable hydrophilicity of the light absorbing layers 150 will be further described in details in the following description related to FIG. 5 to FIG. 9.

In some embodiments, the hydrophilicity of the light absorbing layers 150 may come from the acidic substances in the light absorbing layers 150. Specifically, the light absorbing layers 150 may include hydron which provide the acidic surface material of the light absorbing layers 150, leading to the increased hydrophilicity of the surfaces of the light absorbing layers 150. In some embodiments, the hydron in the light absorbing layers 150 may come from a thermal acid generator (TAG). When the thermal acid generator is heated, the thermal acid generator may produce hydron that provides the hydrophilicity of the surfaces of the light absorbing layers 150. For example, the thermal acid generator may be a salt composed of a cation and a corresponding anion, where the cation produces hydron after being heated. In such embodiments, the light absorbing layers 150 may include the anion from the thermal acid generator. For example, when the thermal acid generator is Diphenyl(4-(phenylthio)phenyl)sulfonium perfluorobutane sulfonate, the light absorbing layers 150 may include the hydron produced by heating the thermal acid generator and the corresponding perfluorobutane sulfonate ion.

In some embodiments, the light absorbing layers 150 may include carbon black, so that the light absorbing layers 150 can absorb the light emitted by the micro light emitting diode chips 110. For example, the carbon black may absorb the wavelength between 380 nm and 780 nm such that the light absorbing layers 150 may absorb the visible light emitted by the micro light emitting diode chips 110. In some embodiments, the light absorbing layers 150 including carbon black may have a suitable thickness, so that the light absorbing layers 150 have a high absorbance in a wavelength range between 540 nm and 560 nm. Specifically, the thickness of the light absorbing layers 150 may be between 1 μm and 2 μm, and the light absorbing layers 150 have an absorbance no less than 99% in a wavelength range between 540 nm and 560 nm. For example, when the thickness of the light absorbing layers 150 is about 1 μm, the light absorbing layers 150 may have an absorbance about 99% at a wavelength about 550 nm. When the thickness of the light absorbing layers 150 is about 2 μm, the light absorbing layers 150 may have an absorbance about 99.9% at a wavelength about 550 nm. If the thickness of the light absorbing layers 150 is smaller than 1 μm, the absorbance of the light absorbing layers 150 may be too low to avoid the light emitted by the micro light emitting diode chips 110 from being reflected by the metal substrate 100 below the light absorbing layer 150. If the thickness of the light absorbing layers 150 is larger than 2 μm, the absorbance of the light absorbing layers 150 may not be significantly improved with the increased thickness while the process cost is rather increased.

In some embodiments, the light absorbing layers 150 may only cover the upper surface of the metal substrate 100 without covering the micro light emitting diode chips 110. As shown in FIG. 3, the light absorbing layers 150 cover the upper surface of the metal substrate 100 between the micro light emitting diode chips 110, while the light absorbing layers 150 do not cover the upper surfaces or the side surfaces of the micro light emitting diode chips 110. As such, the light absorbing layers 150 absorb the light emitted toward the metal substrate 100 by the micro light emitting diode chips 110, and the light emitted toward the light conversion layer 130 by the micro light emitting diode chips 110 is not affected. In some embodiments, the light absorbing layers 150 may directly contact the sidewalls of the micro light emitting diode chips 110. Specifically, the sidewalls of the micro light emitting diode chips 110 may be separated from each other by a gap W1, so that a portion of the metal substrate 100 in the gap W1 is not covered by the micro light emitting diode chips 110. In contrast, the light absorbing layers 150 cover the metal substrate 100 between the micro light emitting diode chips 110 and directly contact the sidewalls of the micro light emitting diode chips 110. Therefore, the light absorbing layers 150 between the micro light emitting diode chips 110 have a width equal to that of the gap W1. For example, the gap W1 separating the micro light emitting diode chips 110 may have a width between about 0.5 μm and 10 μm, so the light absorbing layers 150 between the micro light emitting diode chips 110 have a width between about 0.5 μm and 10 μm.

In some embodiments, the light conversion layer 130 may include a plurality of sub light conversion layers having different materials, where the light emitted by the micro light emitting diode chips 110 can be transferred into different color lights in each sub light conversion layers. For example, the micro light emitting diode chips 110 may be the blue light emitting diodes, and the light conversion layer 130 may include a transparent layer 132, a green light conversion layer 134, and a red light conversion layer 136 separated from each other. When the blue light emitted by the micro light emitting diode chips 110 reaches the transparent layer 132, the blue light may directly pass through the transparent layer 132 to let the micro light emitting diode display 30 emit the blue light. When the blue light emitted by the micro light emitting diode chips 110 respectively reaches the green light conversion layer 134 and the red light conversion layer 136, the blue light may be absorbed by the green light conversion layer 134 and the red light conversion layer 136 emitting the corresponding green light and red light after the absorption. In some embodiments, the green light conversion layer 134 and the red light conversion layer 136 may be a quantum dot layer including semiconductor particles with suitable radius, thereby respectively transferring the blue light emitted by the micro light emitting diode chip 110 into the green light and the red light. In some embodiments, the light conversion layer 130 may further include corresponding color filters to improve the optical quality of the light passing through the light conversion layer 130. For example, the light conversion layer 130 may include a green color filter 135 on the green light conversion layer 134, so that the green light produced from the light sequentially passing through the green light conversion layer 134 and the green color filter 135 has higher color saturation. Similarly, the light conversion layer 130 may include a red color filter 137 on the red light conversion layer 136, so that the red light produced from the light sequentially passing through the red light conversion layer 136 and the red color filter 137 has higher color saturation.

As mentioned above, the structure in FIG. 3 is provided as an example. Other embodiments may include the structures different from that of FIG. 3. In fact, compared with the structure shown in FIG. 3, there may be additional devices and/or material layers, fewer devices and/or material layers, different devices and/or material layers, or different arrangements of devices and/or material layers. For example, one or more interlayer dielectric layers or wires may be disposed in the structure shown in FIG. 3.

Figure 4:
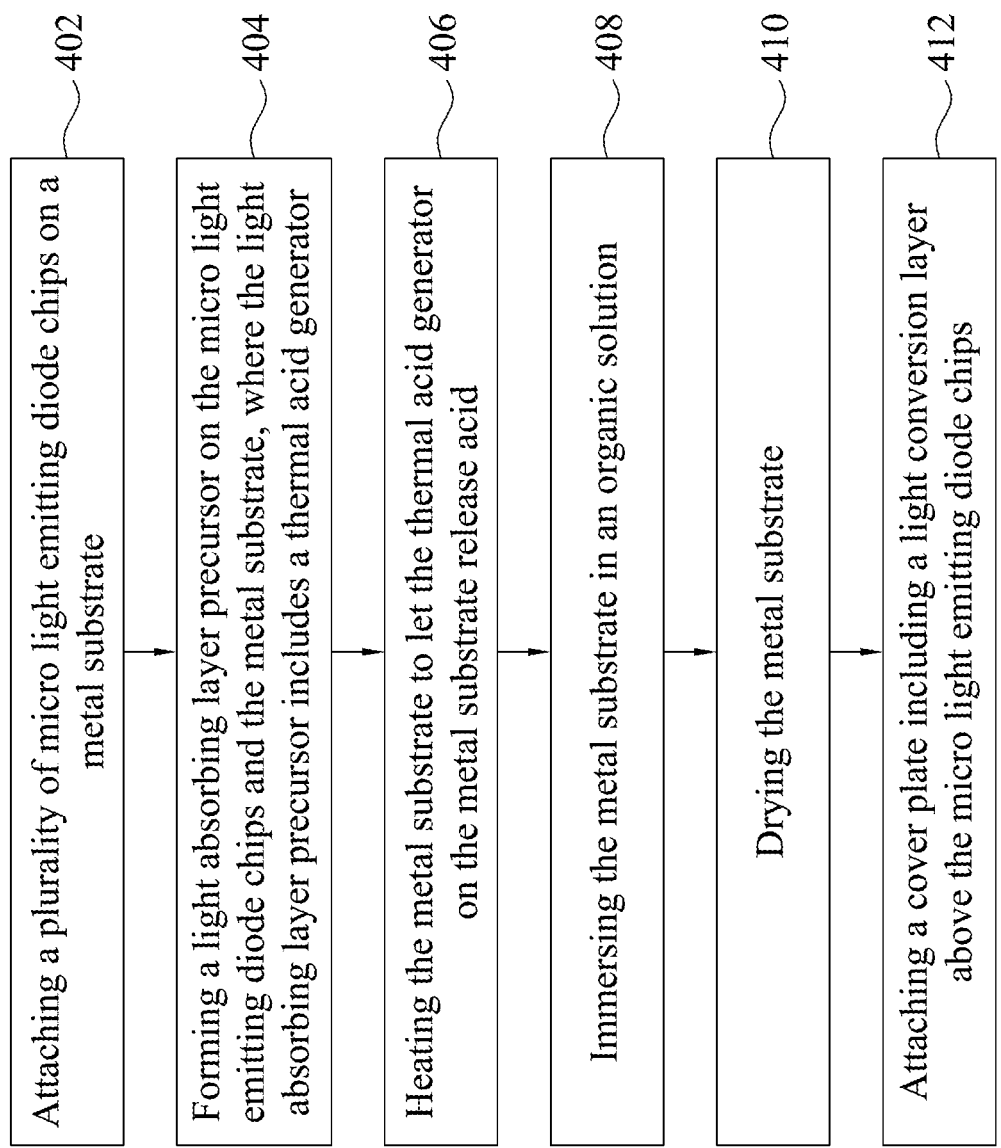
FIG. 4 illustrates a flow diagram of the method of forming the micro light emitting diode display according to some embodiments of this disclosure.

According to some embodiments of this disclosure, FIG. 4 illustrates the flow diagram of the method 400 of forming the micro light emitting diode display. In some embodiments, the method 400 may be used to form the micro light emitting diode display 30 in FIG. 3. FIG. 5, FIG. 6, FIG. 7A, FIG. 8, and FIG. 9 illustrate the cross-sectional views of the intermediate stages of forming the micro light emitting diode display according to the method 400. It should be noted that the process operations illustrated in FIG. 5 to FIG. 7A, FIG. 8, and FIG. 9 are merely examples, and that those skilled in the art may add additional operations before, during, or after the illustrated process, or may substitute, reduce, or logically alter the sequence of the illustrated process operations.

Figure 5:
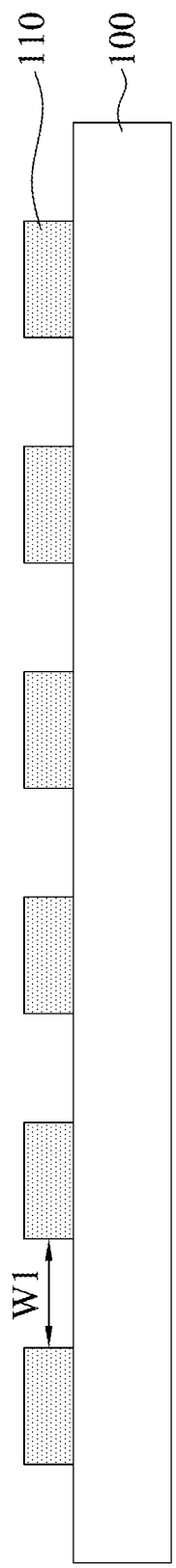

Referring to operation 402 in FIG. 4 and FIG. 5, a plurality of micro light emitting diode chips 110 are attached on a metal substrate 100. The metal substrate 100 includes conductive elements. The electrical connection may be formed between the micro light emitting diode chips 110 and the metal substrate 100 when the micro light emitting diode chips 110 are attached on the metal substrate 100. As shown in FIG. 5, the sidewalls of the micro light emitting diode chips 110 are separated by the gap W1, so that the micro light emitting diode chips 110 are not contacted to each other. In some embodiments, when the micro light emitting diode chips 110 are attached on the metal substrate 100, the micro light emitting diode chips 110 may have the gap W1 with a suitable width to decrease the interference between the micro light emitting diode chips 110 or to satisfy the process tolerance. For example, when the size of the micro light emitting diode chips 110 are between 3 μm and 30 μm, the gap W1 separating the micro light emitting diode chips 110 may have a width between 0.5 μm and 10 μm.

In some embodiments, the micro light emitting diode chips 110 may be attached on the metal substrate 100 by the mass transfer technique. Specifically, the micro light emitting diode chips 110 may first be formed on an additional substrate, such as a sapphire substrate with a flat upper surface. Then, the micro light emitting diode chips 110 on the additional substrate are attached to the metal substrate 100, so that the micro light emitting diode chips 110 are between the additional substrate and the metal substrate 100. The micro light emitting diode chips 110 are then detached from the additional substrate by using a power source (such as radiation), leading to the formation of the micro light emitting diode chips 110 on the metal substrate 100.

Figure 6:
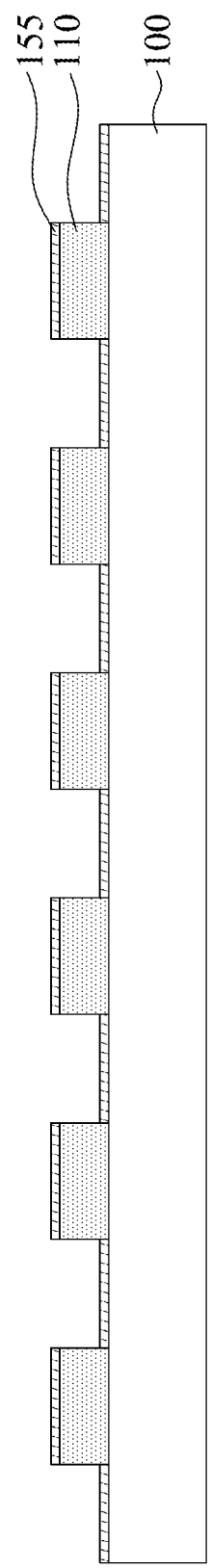

Referring to operation 404 in FIG. 4 and FIG. 6, a light absorbing layer precursor 155 is formed on the micro light emitting diode chips 110 and the metal substrate 100, where the light absorbing layer precursor 155 includes a thermal acid generator. Specifically, the light absorbing layer precursor 155 including the thermal acid generator is formed on the upper surfaces of the micro light emitting diode chips 110 and the exposed upper surface of the metal substrate 100. As a result, the light absorbing layer precursor 155 covers the upper surfaces of the micro light emitting diode chips 110 and the upper surface of the metal substrate 100 between the micro light emitting diode chips 110. Therefore, the micro light emitting diode chips 110 and the metal substrate 100 may be covered by the light absorbing layer precursor 155 in a top view. In the following process, the thermal acid generator in the light absorbing layer precursor 155 may be heated to produce hydron, so that the surface of the light absorbing layer precursor 155 is acidic, and the hydrophilicity of the light absorbing layer precursor 155 is increased.

In some embodiments, the thermal acid generator in the light absorbing layer precursor 155 may include a sulfonium salt, such as Diphenyl(4-(phenylthio)phenyl)sulfonium. The sulfonium ion in the sulfonium salt may produce hydron after being heated, thereby increasing the hydrophilicity of the light absorbing layer precursor 155. In some embodiments, the thermal acid generator may include Diphenyl(4-(phenylthio)phenyl)sulfonium and the corresponding anion. For example, the thermal acid generator may be selected from Diphenyl(4-(phenylthio)phenyl)sulfonium perfluorobutane sulfonate, Diphenyl(4-(phenylthio)phenyl)sulfonium 4-adamantanecarboxy-1,1,2,2,-tetrafluorobutane sulfonate, Diphenyl(4-(phenylthio)phenyl)sulfonium 3-hydroxy-4-adamantanecarboxyl-1,1,2,2-tetrafluorobutane sulfonate, Diphenyl(4-(phenylthio)phenyl)sulfonium adamantanyl-methoxycarbonyl-difluoromethane sulfonate, Diphenyl(4-(phenylthio)phenyl)sulfonium 3-hydroxyadamantanyl-methoxycarbonyl-difluoromethane sulfonate, or Diphenyl(4-(phenylthio)phenyl)sulfonium 4-dehydrocholate-1,1,2,2-tetrafluorobutane sulfonate. In some embodiments, the light absorbing layer precursor 155 may have a suitable concentration of the thermal acid generator, so that the required amount of hydron may be produced in the light absorbing layer precursor 155 in the subsequent process. For example, the concentration of the thermal acid generator in the light absorbing layer precursor 155 may be between 0.1 wt % and 5 wt %. If the concentration of the thermal acid generator is lower than 0.1 wt %, the thermal acid generator in the light absorbing layer precursor 155 may be too low to produce sufficient hydron and to increase the hydrophilicity of the light absorbing layer precursor 155. If the concentration of the thermal acid generator is higher than 5 wt %, it may affect the viscosity or the absorbance of the light absorbing layer precursor 155.

Figure 8:
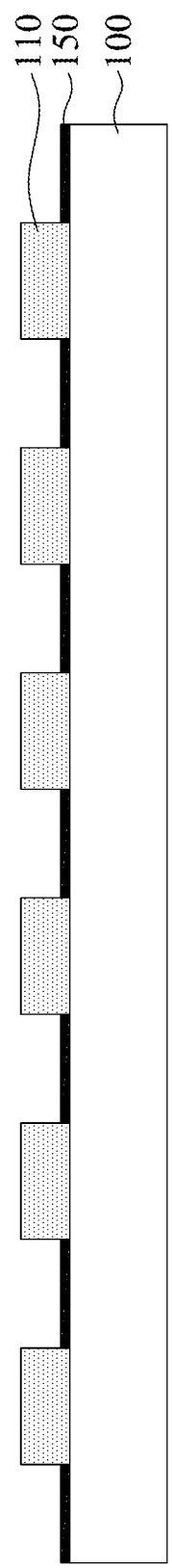

In some embodiments, the light absorbing layer precursor 155 may have a relative hydrophobicity, so that the light absorbing layer precursor 155 has a relative high contact angle. For example, the contact angle of the light absorbing layer precursor 155 may be between 70 degrees and 90 degrees. As the light absorbing layer precursor 155 is relative hydrophobic and a portion of the light absorbing layer precursor 155 is heated, the thermal acid generator in the heated portion of the light absorbing layer precursor 155 can produce hydron, thereby increasing the hydrophilicity of the light absorbing layer precursor 155. In contrast, the unheated portion of the light absorbing layer precursor 155 remains its relative hydrophobicity. Therefore, the unheated portion of the light absorbing layer precursor 155 and the heated portion of the light absorbing layer precursor 155 may have a significant difference of hydrophobicity/hydrophilicity. In the subsequent process, this characteristic difference may simplify the differentiation between the unheated portion of the light absorbing layer precursor 155 and the heated portion of the light absorbing layer precursor 155 (as shown in FIG. 8).

In some embodiments, the light absorbing layer precursor 155 may further include carbon black, so that the light absorbing layer precursor 155 absorbs the light emitted by the micro light emitting diode chips 110. For example, the carbon black in the light absorbing layer precursor 155 may absorb the wavelength between 380 nm and 780 nm, so the light absorbing layer precursor 155 absorbs the visible light emitted by the micro light emitting diode chips 110.

In some embodiments, the light absorbing layer precursor 155 may be formed by spin coating the light absorbing layer precursor 155 on the micro light emitting diode chips 110 and the metal substrate 100 between the micro light emitting diode chips 110. More specifically, the light absorbing layer precursor 155 may cover the upper surfaces of the micro light emitting diode chips 110 and the exposed upper surface of the metal substrate 100, while the light absorbing layer precursor 155 do not cover the side surfaces of the micro light emitting diode chips 110. In some embodiments, the light absorbing layer precursor 155 on the metal substrate 100 between the micro light emitting diode chips 110 may directly contact the sidewalls of the micro light emitting diode chips 110, so that the width of the light absorbing layer precursor 155 equals to that of the gap, such as the gap W1 in FIG. 5, between the micro light emitting diode chips 110. For example, the light absorbing layer precursor 155 on the metal substrate 100 between the micro light emitting diode chips 110 may have a width between 0.5 μm and 10 μm.

Figure 7A:
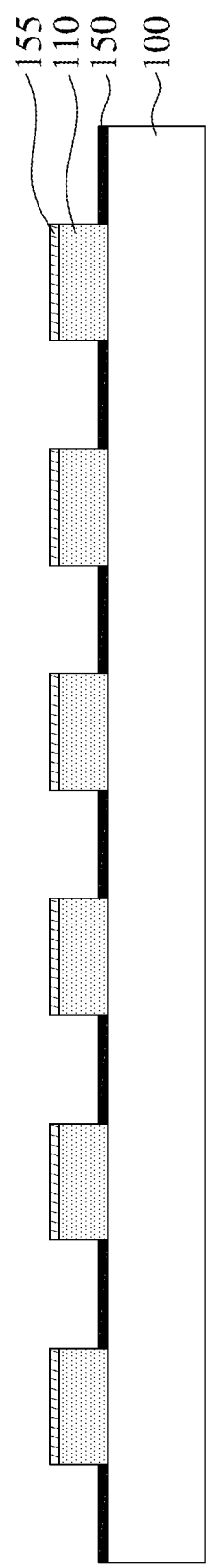

Referring to operation 406 in FIG. 4 and FIG. 7A, the metal substrate 100 is heated to let the thermal acid generator in the light absorbing layer precursor 155 on the metal substrate 100 release acids. Specifically, the metal substrate 100 is heated to heat a portion of the light absorbing layer precursor 155 on the metal substrate 100. The thermal acid generator in the light absorbing layer precursor 155 is heated to produce hydron, which provides the acidic substances in the surface of the light absorbing layer precursor 155 on the metal substrate 100. In contrast, the other portion of the light absorbing layer precursor 155 on the micro light emitting diode chips 110 is not heated and remained the composition of the light absorbing layer precursor 155. As a result, the light absorbing layer precursor 155 on the metal substrate 100 is more acidic than the light absorbing layer precursor 155 on the micro light emitting diode chips 110 after the heating operation. Therefore, the light absorbing layer precursor 155 on the metal substrate 100 forms the relative hydrophilic light absorbing layers 150, where the composition of the light absorbing layers 150 is different from that of the light absorbing layer precursor 155 on the micro light emitting diode chips 110.

Figure 7B:
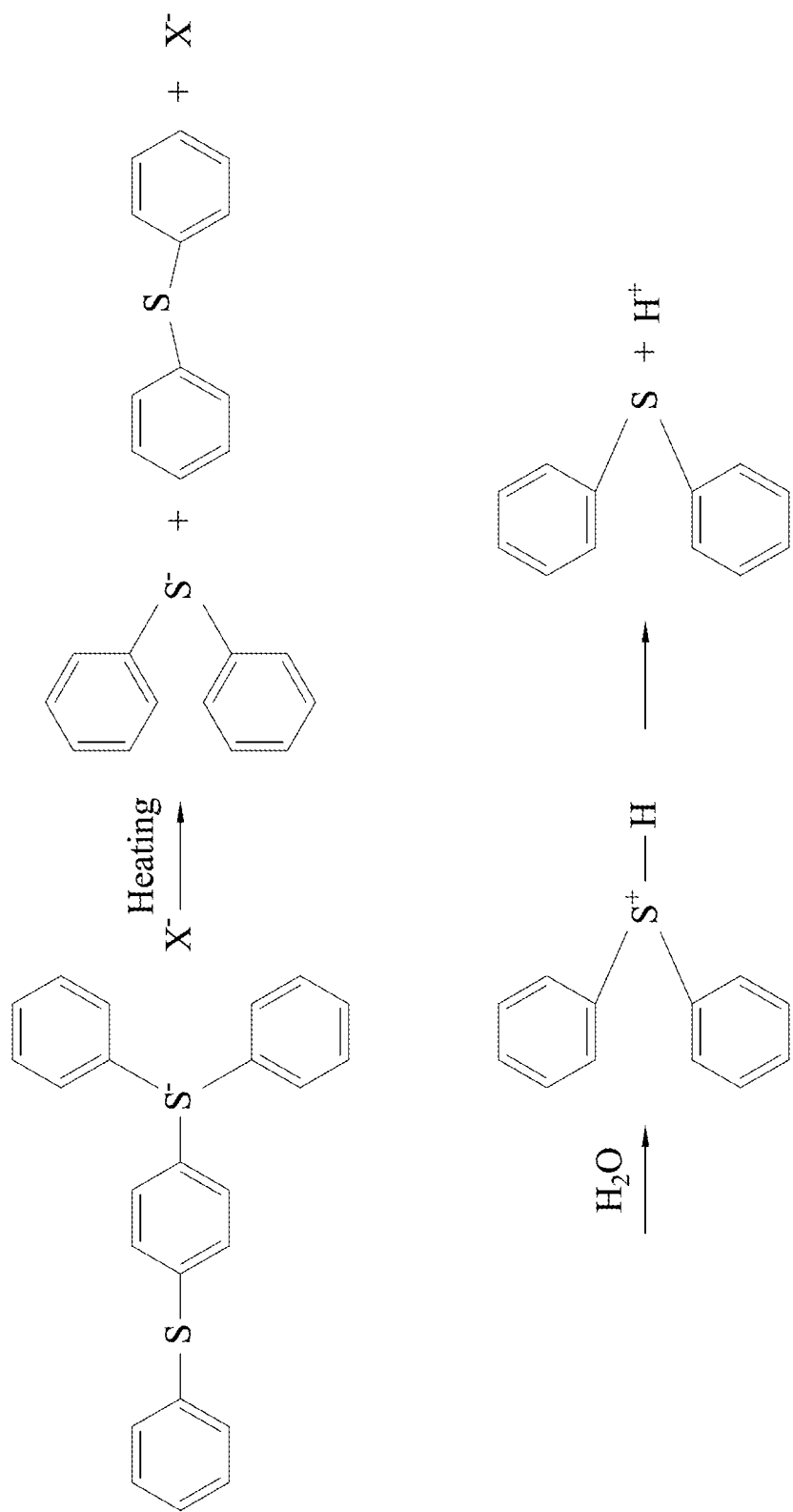
FIG. 7B illustrates a schematic view of the acid release reaction of the thermal acid generator.

According to some embodiments, FIG. 7B illustrates the schematic view of the acid release reaction of the thermal acid generator, where Diphenyl(4-(phenylthio)phenyl)sulfonium salt is presented as an example of the thermal acid generator. As shown in FIG. 7B, Diphenyl(4-(phenylthio)phenyl)sulfonium salt includes Diphenyl(4-(phenylthio)phenyl)sulfonium ion and its corresponding anion $X^-$. Diphenyl(4-(phenylthio)phenyl)sulfonium ion produces sulfur-containing anion after being heated, and the sulfur-containing anion reacts with $H_2O$ in the environment to produce hydron. As a result, the thermal acid generator in the light absorbing layer precursor 155 may release acids after being heated, thereby increasing the hydrophilicity of the light absorbing layer precursor 155.

In some embodiments, after heating the metal substrate 100, the light absorbing layer precursor 155 on the metal substrate 100 (or referred as the light absorbing layers 150) may have suitable hydrophilicity, so that the light absorbing layers 150 on the metal substrate 100 and the light absorbing layer precursor 155 on the micro light emitting diode chips 110 have a significant difference of hydrophilicity/hydrophobicity. For example, the contact angle of the light absorbing layers 150 on the metal substrate 100 may be between 0 degree and 30 degrees.

In some embodiments, heating the metal substrate 100 may include heating the metal substrate 100 with suitable temperature and short time period, so that the light absorbing layer precursor 155 on the metal substrate 100 forms the light absorbing layers 150. For example, the metal substrate 100 may be heated about 30 seconds to 300 seconds with a temperature between about 100° C. and 140° C. In some preferred embodiments, the metal substrate 100 may be heated about 60 seconds with a temperature about 120° C. If the metal substrate 100 is heated with a temperature lower than 100° C., the temperature of the metal substrate 100 may be too low to promote the acid release reaction of the thermal acid generator. If the metal substrate 100 is heated with a temperature higher than 140° C., the light absorbing layer precursor 155 may deteriorate due to the high temperature, which affects the optical quality of the micro light emitting diode chips 110.

Referring to operation 408 in FIG. 4 and FIG. 8, the metal substrate 100 is immersed in an organic solution. When the metal substrate 100 is immersed in the organic solution, the light absorbing layer precursor 155 on the micro light emitting diode chips 110 is redissolved in the organic solution and removed from the micro light emitting diode chips 110. In contrast, the light absorbing layers 150 on the metal substrate 100 are insoluble in the organic solution, so that the light absorbing layers 150 are remained on the metal substrate 100, especially on the metal substrate 100 between the micro light emitting diode chips 110. Therefore, the light absorbing layer precursor 155 on the metal substrate 100 (or referred as the light absorbing layers 150) forms the plurality of the light absorbing layers 150 between the micro light emitting diode chips 110.

In some embodiments, the metal substrate 100 may be immersed in the organic solution such as non-polar organic solution. As such, the relative hydrophobic light absorbing layer precursor 155 on the micro light emitting diode chips 110 is soluble in the organic solution, while the relative hydrophilic light absorbing layers 150 on the metal substrate 100 are relatively insoluble in the organic solution. For example, the organic solution immersing the metal substrate 100 may include propylene glycol methyl ether acetate (PGMEA). Therefore, the light absorbing layer precursor 155 with the contact angle no lower than 70 degrees is dissolved in the organic solution, and the light absorbing layers 150 with the contact angle no higher than 30 degrees are remained on the metal substrate 100.

It should be noted that, combining the operation 406 and operation 408 of the method 400, the patterning of the light absorbing layers 150 is completed by using the simplified process operations. In particular, the gap between the micro light emitting diode chips 110 is very small since the size of the micro light emitting diode chips 110 is also very small. For example, when the size of the micro light emitting diode chips 110 is no larger than 30 μm, the gap between the micro light emitting diode chips 110 may be no larger than 10 μm. In general, as the gap between the micro light emitting diode chips is small, the patterning of the light absorbing layer requires the photolithography process with high accuracy. However, the metal substrate of the micro light emitting diode display might reflect the light used in the photolithography process, leading to the reflective light reaching the undesired exposed region nearby. As a result, the reflective light in the photolithography process induces the cross-linking reaction of the light absorbing layer in the undesired exposed region, which reduces the patterning accuracy. In contrast, due to the different solubility of the relative hydrophobic light absorbing layer precursor 155 and the relative hydrophilic light absorbing layers 150 in the organic solution, the light absorbing layer precursor 155 on the micro light emitting diode chip 110 may be removed while remaining the light absorbing layers 150 on the metal substrate 100 in the operation 406 and operation 408. Therefore, the method 400 may pattern the light absorbing layers 150 in the small gaps between the micro light emitting diode chips 110 by the simplified heating operation and redissolving operation.

Figure 9:
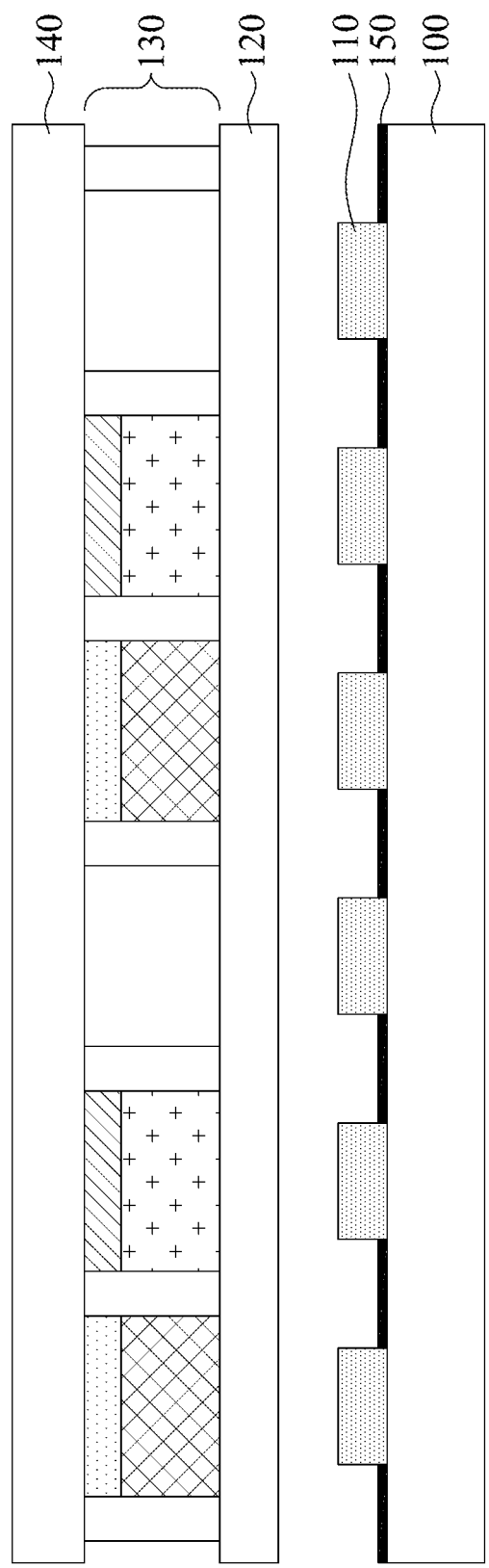

Referring to operation 410 and operation 412 in FIG. 4 and FIG. 9, the metal substrate 100 is dried, and a cover plate 140 including a light conversion layer 130 is attached above the micro light emitting diode chips 110. Specifically, the patterned light conversion layer 130 may first be formed on the cover plate 140, where the light conversion layer 130 includes separated sub light conversion layers. After the metal substrate 100 is dried, a transparent substrate 120 is attached above the micro light emitting diode chips 110, so that the cover plate 140 including the light conversion layer 130 may be attached above the micro light emitting diode chips 110. After the cover plate 140 is attached above the micro light emitting diode chips 110, the light conversion layer 130 is disposed between the cover plate 140 and the micro light emitting diode chips 110, and each of the sub light conversion layers of the light conversion layer 130 is aligned with the corresponding micro light emitting diode chip 110. Therefore, the light emitted by the micro light emitting diode chips 110 may sequentially pass through the transparent substrate 120, the light conversion layer 130, and the cover plate 140.

According to the above-mentioned embodiments of this disclosure, the micro light emitting diode display of the disclosure includes a metal substrate, a plurality of micro light emitting diode chips on the metal substrate, and a plurality of light absorbing layers on the metal substrate between the micro light emitting diode chips. The light absorbing layer absorbs the light emitted toward the metal substrate by the micro light emitting diode chips, thereby avoiding the light reflection toward the region above the adjacent micro light emitting diode chip by the metal substrate. Therefore, the light absorbing layers on the metal substrate between the micro light emitting diode chips can avoid the light cross-talk. In addition, the method of forming the micro light emitting diode display of this disclosure includes forming the light absorbing layer precursor with the thermal acid generator, heating the light absorbing layer precursor on the metal substrate, and redissolving the light absorbing layer precursor on the micro light emitting diode chip. Due to the relative hydrophilic light absorbing layers formed after the heating operation and the relative hydrophobic light absorbing layer precursor not being heated, the light absorbing layer precursor or the light absorbing layers may be patterned by simplified redissolving operation, which reduces the process cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro light emitting diode display, comprising:
a metal substrate;
a plurality of micro light emitting diode chips on the metal substrate, wherein sidewalls of the micro light emitting diode chips are separated by a gap;
a plurality of light absorbing layers on the metal substrate between the micro light emitting diode chips, wherein a water drop contact angle of the light absorbing layers is between 0 degree and 30 degrees;
a light conversion layer above the micro light emitting diode chips; and
a cover plate above the light conversion layer.

2. The micro light emitting diode display of claim 1, wherein the light absorbing layers comprise a carbon black and anions from a thermal acid generator.

3. The micro light emitting diode display of claim 1, wherein a wavelength absorbed by the light absorbing layers is between 380 nm and 780 nm.

4. The micro light emitting diode display of claim 1, wherein the light absorbing layers have an absorbance no less than 99% in a wavelength range between 540 nm and 560 nm.

5. The micro light emitting diode display of claim 1, wherein a thickness of the light absorbing layers is between 1 μm and 2 μm.

6. The micro light emitting diode display of claim 1, wherein the light absorbing layers directly contact the sidewalls of the micro light emitting diode chips.

7. The micro light emitting diode display of claim 1, wherein the gap separating the micro light emitting diode chips is between 0.5 μm and 10 μm.

8. The micro light emitting diode display of claim 1, wherein the light absorbing layers do not cover the micro light emitting diode chips.

9. The micro light emitting diode display of claim 1, wherein the light conversion layer comprises quantum dot layers and corresponding color filters.

10. The micro light emitting diode display of claim 9, wherein the quantum dot layers transfer a blue light emitted by the micro light emitting diode chips into a red light or a green light.

11. The micro light emitting diode display of claim 1, wherein the light absorbing layers comprises acidic substances produced from a thermal acid generator.

12. The micro light emitting diode display of claim 11, wherein the thermal acid generator is selected from Diphenyl(4-(phenylthio)phenyl)sulfonium perfluorobutane sulfonate, Diphenyl(4-(phenylthio)phenyl)sulfonium 4-adamantanecarboxy-1,1,2,2,-tetrafluorobutane sulfonate, Diphenyl(4-(phenylthio)phenyl)sulfonium 3-hydroxy-4-adamantanecarboxyl-1,1,2,2-tetrafluorobutane sulfonate, Diphenyl(4-(phenylthio)phenyl)sulfonium adamantanyl-methoxycarbonyl-difluoromethane sulfonate, Diphenyl(4-(phenylthio)phenyl)sulfonium 3-hydroxyadamantanyl-methoxycarbonyl-difluoromethane sulfonate, or Diphenyl(4-(phenylthio)phenyl)sulfonium 4-dehydrocholate-1,1,2,2-tetrafluorobutane sulfonate.

13. The micro light emitting diode display of claim 1, wherein the light absorbing layers are insoluble in non-polar organic solution.

14. The micro light emitting diode display of claim 1, wherein a width of one of the light absorbing layers along a direction equals to a width of the gap separating the micro light emitting diode chips along the direction.

15. The micro light emitting diode display of claim 1, wherein a thickness of one of the light absorbing layers along a direction perpendicular to a top surface of the metal substrate is thinner than a thickness of one of the micro light emitting diode chips alone the direction.

16. The micro light emitting diode display of claim 1, wherein the micro light emitting diode chips emit light toward the metal substrate through the sidewalls.

17. The micro light emitting diode display of claim 1, wherein a width of one of the micro light emitting diode chips along a direction is smaller than or equal to 30 μm, and a width of the gap separating the micro light emitting diode chips along the direction is smaller than or equal to 10 μm.

18. The micro light emitting diode display of claim 1, wherein a top surface of the metal substrate is directly covered by the micro light emitting diode chips and the light absorbing layers.

19. The micro light emitting diode display of claim 1, further comprising a transparent substrate between the micro light emitting diode chips and the light conversion layer and between the light absorbing layers and the light conversion layer.

20. The micro light emitting diode display of claim 1, wherein the light conversion layer comprises a plurality of sub light conversion layers aligned with the micro light emitting diode chips, respectively, and wherein adjacent two of the sub light conversion layers correspond to lights with different wavelengths.

* * * * *